United States Patent
Lee et al.

(10) Patent No.: US 7,105,877 B2
(45) Date of Patent: Sep. 12, 2006

(54) CONDUCTIVE LINE STRUCTURE

(75) Inventors: Chun-Yu Lee, Sinying (TW); Ping-Chin Cheng, Taipei (TW)

(73) Assignee: AU Optronics Corp., Hsinchu (TW)

( * ) Notice: Subject to any disclaimer, the term of this patent is extended or adjusted under 35 U.S.C. 154(b) by 171 days.

(21) Appl. No.: 10/903,624

(22) Filed: Jul. 30, 2004

(65) Prior Publication Data
US 2006/0006537 A1    Jan. 12, 2006

(30) Foreign Application Priority Data
Jul. 7, 2004    (TW) ............................... 93120335 A

(51) Int. Cl.
*H01L 21/82* (2006.01)

(52) U.S. Cl. ............................ 257/232; 438/6; 438/12; 438/13; 438/130; 438/141; 257/E23.152

(58) Field of Classification Search ................ 438/130, 438/6, 12, 13, 141; 257/232, E23.152
See application file for complete search history.

(56) References Cited

U.S. PATENT DOCUMENTS

| | | | | |
|---|---|---|---|---|
| 6,174,753 B1 * | 1/2001 | Liao | ............................ | 438/132 |
| 6,512,503 B1 * | 1/2003 | Kim et al. | ..................... | 345/87 |
| 6,940,128 B1 * | 9/2005 | Matsuki et al. | ............. | 257/341 |
| 2004/0239364 A1 * | 12/2004 | Chung | ........................ | 324/770 |

* cited by examiner

Primary Examiner—George R. Fourson
Assistant Examiner—Thanh V. Pham
(74) Attorney, Agent, or Firm—Thomas, Kayden, Horstemeyer & Risley

(57) ABSTRACT

A conductive line Structure. In one embodiment of the invention, a conductive line includes at least two outer conductive portions, an inner conductive portion between the outer conductive portions, separated from the outer conductive portions by at least two trenches along the conductive line, and at least one connecting portion disposed in each trench connecting the inner conductive portion and the outer conductive portions.

18 Claims, 7 Drawing Sheets

CONDUCTIVE LINE STRUCTURE

BACKGROUND OF THE INVENTION

1. Field of the Invention

The present invention relates to the package of a display panel and in particular to a bonding pad structure for a display panel.

2. Description of the Related Art

Generally, an active matrix liquid crystal display uses thin film transistors (TFTs) as switching devices to display a natural-looking moving picture. Since such a liquid crystal displays offer size reduction over cathode ray tube displays, they are commercially viable for use as monitors such in portable televisions, lap-top personal computers and the like.

Active matrix liquid crystal display images corresponding to video signals such as television signals on a pixel matrix having pixels arranged at each intersection between gate lines and data lines. Each pixel includes a liquid crystal display cell for controlling a quantity of transmitted light in accordance with a voltage level of a data signal from a data line. A TFT (thin film transistor) is installed at an intersection between a gate line and a data line to switch a data signal to be transferred to the liquid crystal cell in response to a scanning signal from the gate line.

Such a liquid crystal display requires a number of integrated circuits (ICs) connected to the data lines and the gate lines, respectively. The ICs are installed between the flexible printed board and the liquid crystal panel to apply signals. IC mounting methods include tape automated bonding, hereinafter referred to as "TAB" and flexible printed board circuit, hereinafter referred to as "FPC".

As in FIG. 1, two conductive lines 102, 104 may experience shorts if a particle 106 falls therebetween during a TAB or FPC process. The problem resulting from the situation described can be solved by either replacing conducting lines 102,104 with new material, thereby eliminating particle 106, or by pulverizing the particle 106 with a laser. Material replacement, however, is expensive and time consuming, and laser smashing cannot effectively remove large particles.

Additionally in subsequent process, a first conductive line 202 may be easily shorted via contact with adjacent misaligned bonding line 208 by conductive particles 206 of ACF (Anisotropic Conductive Film) located therebetween.

SUMMARY OF THE INVENTION

Accordingly, an object of the invention is to provide a conductive line easily reworked by laser when particles are formed therebetween or bonding lines are misaligned.

To achieve the above objects, the present invention provides a conductive line comprising at least two outer conductive portions, an inner conductive portion between the outer conductive portions, separated with the outer conductive portions by at least two trenches along the conductive line, and at least one connecting portion disposed in each trench connecting the inner conductive portion and the outer conductive portions.

The present invention provides another conductive line comprising, a first conductive layer with at least two outer conductive portions, an inner conductive portion between the outer portions, and a plurality of connecting portions, wherein the inner conductive portion and the outer conductive portions are separated by trenches along the conductive line and connected by the connecting portions; a dielectric layer disposed on the first conductive layer without covering the trenches and the connecting portions; a second conductive layer disposed on the dielectric layer without covering the connecting portions and the trenches; and a third conductive layer disposed on the second conductive layer and the connecting portions without covering the trenches.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1:
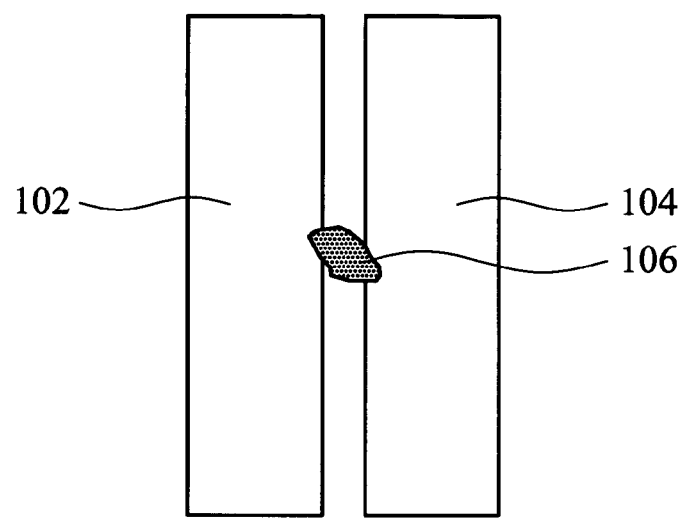
FIG. 1 is a top view of conventional conductive lines with a particle disposed therebetween.
Figure 2:
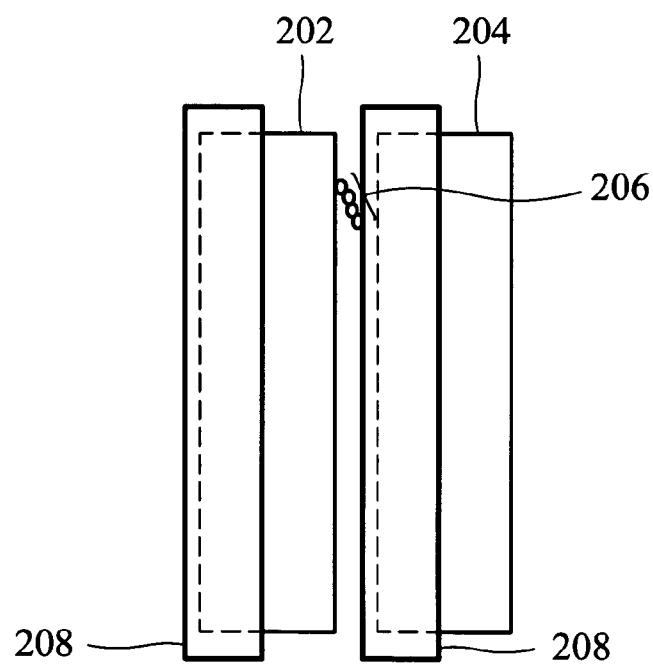
FIG. 2 is a top view of conventional conductive lines bonded with misaligned bonding lines.
Figure 3:
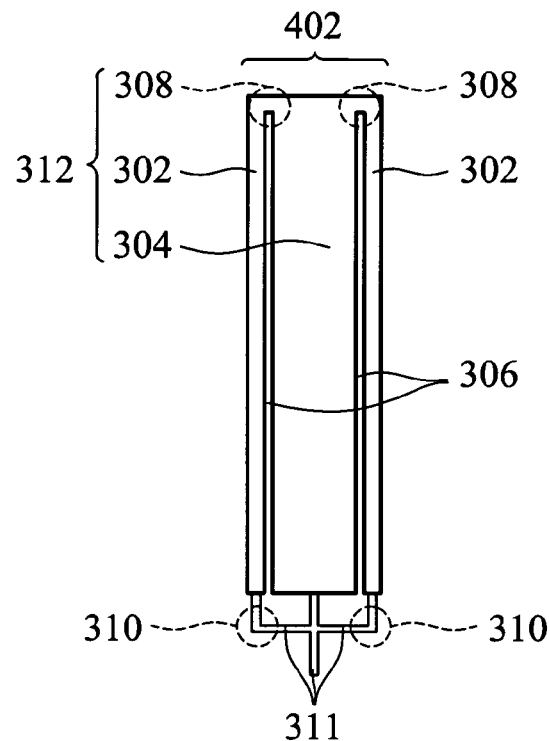
FIG. 3 is a top view of a conductive line of the first embodiment.

As shown in FIG. 3, a structure of a conductive line includes at least two outer conductive portions 302 and an inner conductive portion 304 between the outer conductive portions 302, separated from each other by at least two trenches 306 along the conductive line. The inner conductive portion 304 and the outer conductive portions 302 are electrically open for the two trenches 306 along the conductive line. The inner conductive portion 304 and the outer conductive portions 302 are connected by at least one connecting portion 308,310 corresponding to each trench 306.

In a preferred embodiment of the invention, the first connecting portion 308 is on one end of the conductive line, and the second connecting portion is on the other end the conductive line. The inner conductive portion 304 and the outer conductive portions 302 can be connected by a plurality of connecting lines 311, in which the line connecting the inner conductive portion 304 and the outer conductive portions 302 can be referred to as a connection potion 310. The conductive line 312 is preferably formed of conductive materials, such as Ta, Mo, W, Cr, Al, ITO, or their combination.

The first connecting portion 308 and the second connecting portion 310 are preferably thinner than the inner conductive portion 304 and the outer conductive portions 302, such that they are easily cut by laser. The width of the inner conductive portion 304 is preferably larger than the outer conductive portion 306, such that the conductive line 312 remains a low resistance. The conductive line 312 is preferably formed on a display panel.

Figure 4:
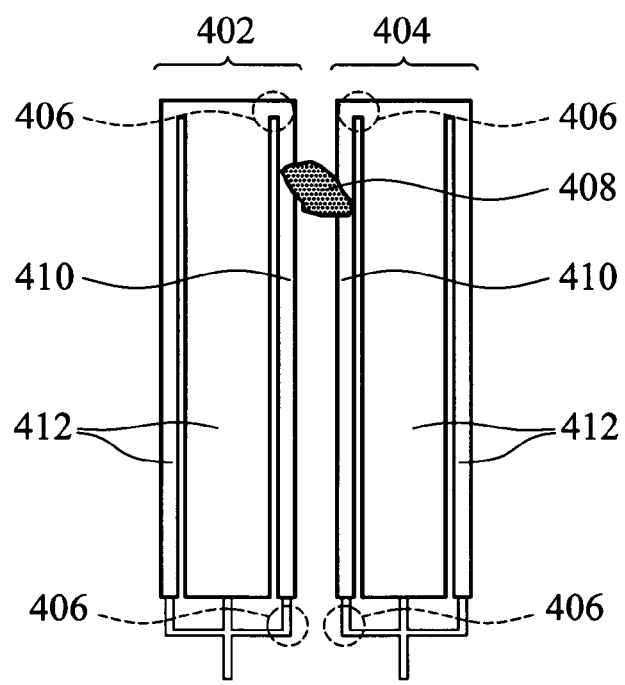
FIG. 4 is a top view of the conductive lines of the first embodiment with a particle disposed therebetween.

As shown in FIG. 4, the first conductive line 402 and the second conductive line 404 can be repaired by cutting the connecting portions 406 of the first conductive line 402 and the second connecting line 404 with a laser if a particle 408 is disposed therebetween. Consequently, the outer conductive portions 410 adjacent to the particle 408 are electrically open with the remaining portions 412 of the first and the second conductive lines 402,404.

Figure 5:
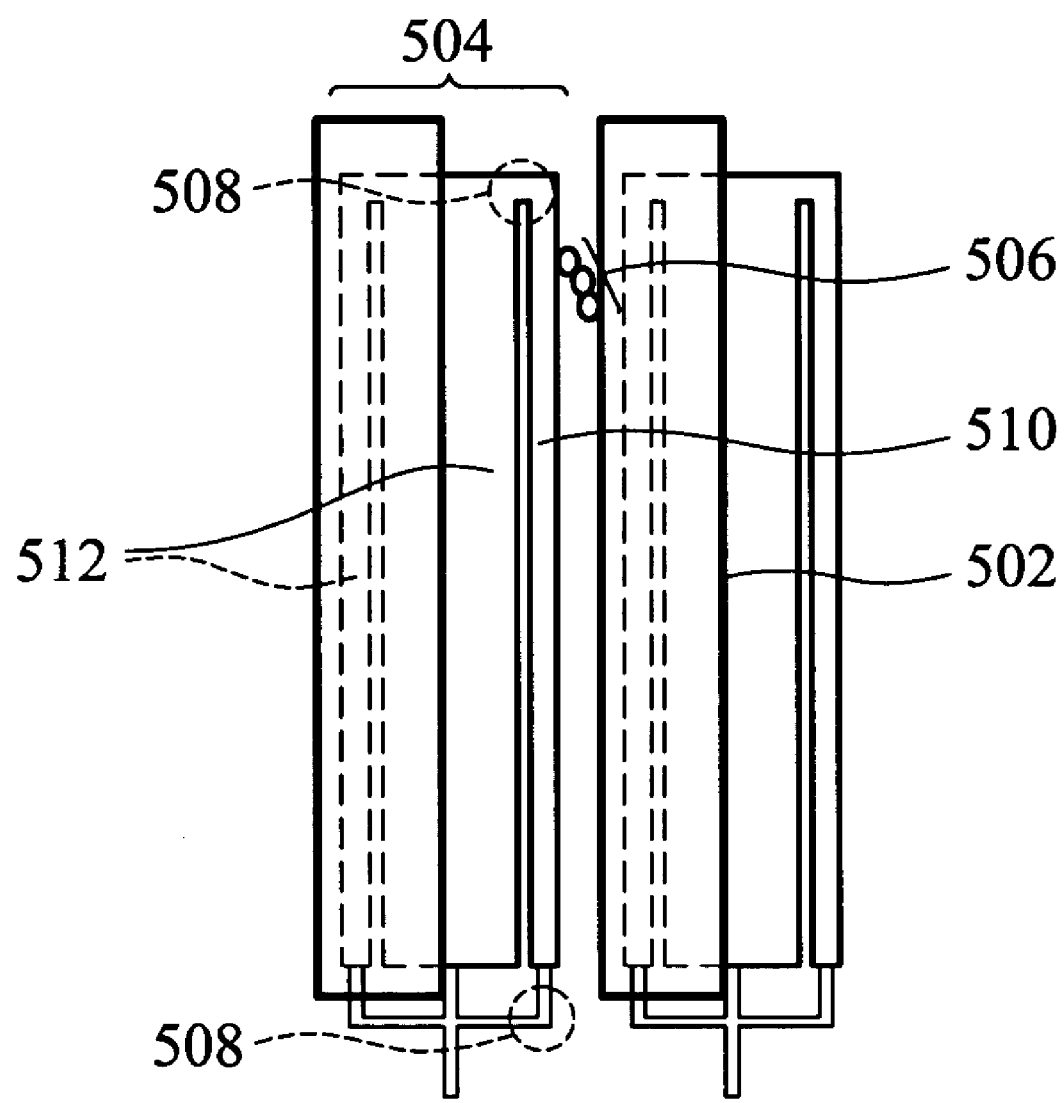
FIG. 5 is a top view of the conductive lines of the first embodiment bonded with misaligned bonding lines.

As shown in FIG. 5, if a bonding line 502 is misaligned and connected with the adjacent conductive line 504 by the conductive particles 506 of ACF, the conductive line 504 can be repaired by cutting the connecting portions 508 close to the misaligned bonding line 502. Accordingly, the outer conductive portion 510 close to the misaligned bonding line 502 is electrically open with the remaining portions 512 of the conductive line 504.

Figure 6A:
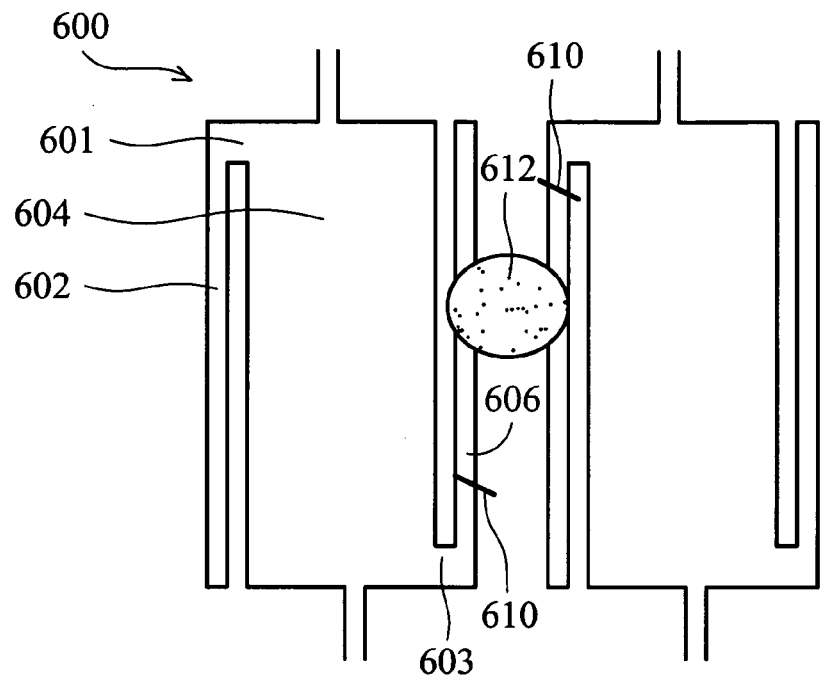
FIG. 6A is a top view of a conductive line of the first embodiment, showing the connecting portion is at end the conductive line.

In another preferred embodiment of the invention, there can be only one connecting portion connecting each outer conductive portion and inner conductive portion. The position of the connecting portion can be disposed in any portion of the corresponding trench. For example, as shown in FIG. 6A, the first connecting portion 601 connecting the first outer conductive portion 602 and the inner portion 604 is disposed at one end of the conductive line 600. The second connecting portion 603 connecting the second outer conductive portion 606 and the inner portion 604 is disposed at the other end of the conductive line 600.

Figure 6B:
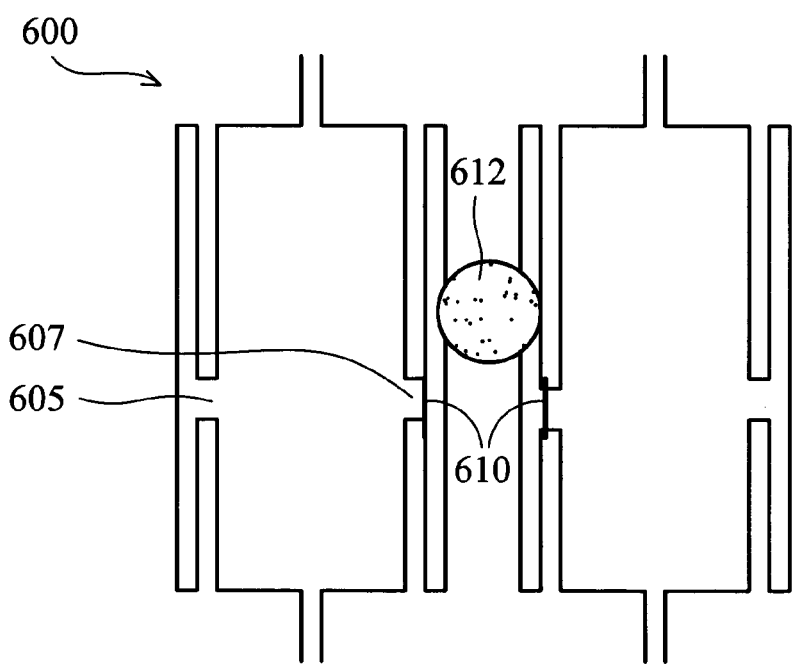
FIG. 6B is a top view of a conductive line of the first embodiment, showing the connecting portion is at middle of the conductive line.

In still another preferred embodiment of the invention, as shown in and FIG. 6B, the first connecting portion 605 and the second connecting portion 607 are disposed in the middle of the conductive line 600. Thus only one laser cut 610 is required to cut the outer conductive portion 606 in FIG. 6A, or the connecting portion 607 in FIG. 6B to repair the conductive line 600, if a particle 612 is disposed between two conductive lines.

Second Embodiment

Figure 7A:
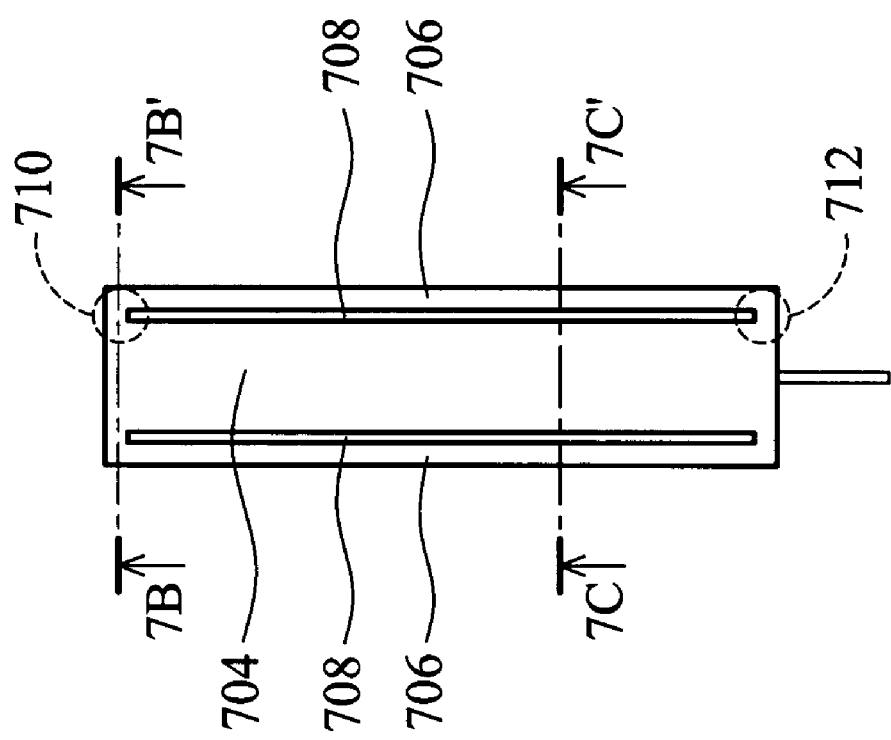
FIG. 7A is a top view of the conductive line of the second embodiment.
Figure 7B:
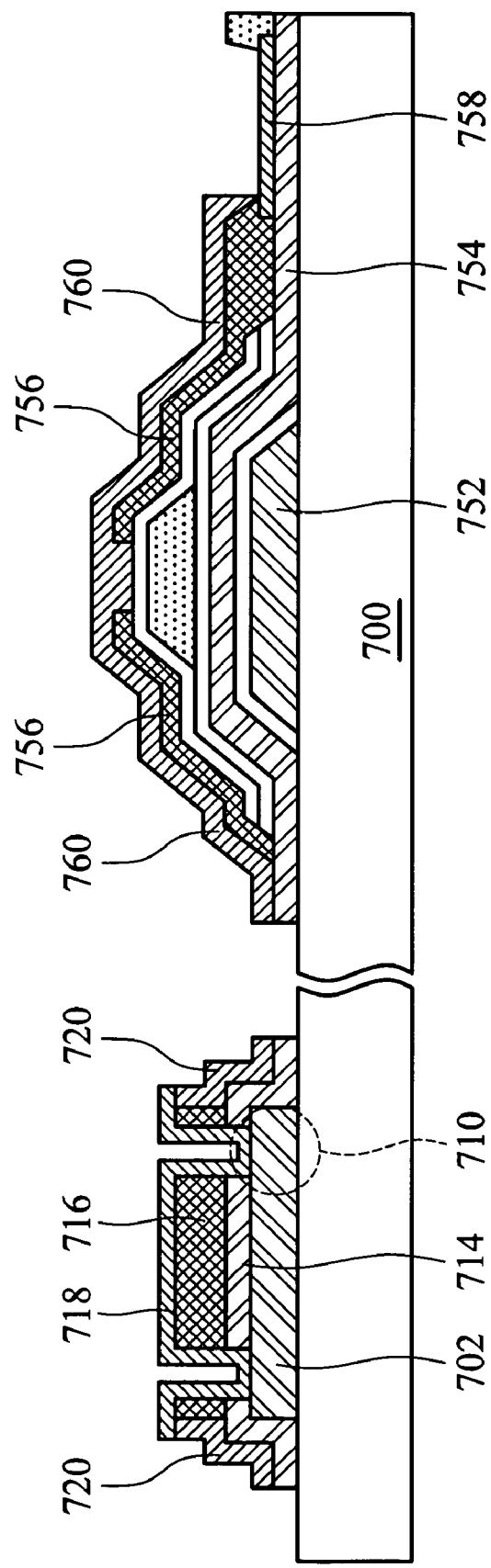
FIG. 7B is a cross section along the line 7B–7B' of FIG. 6A.
Figure 7C:
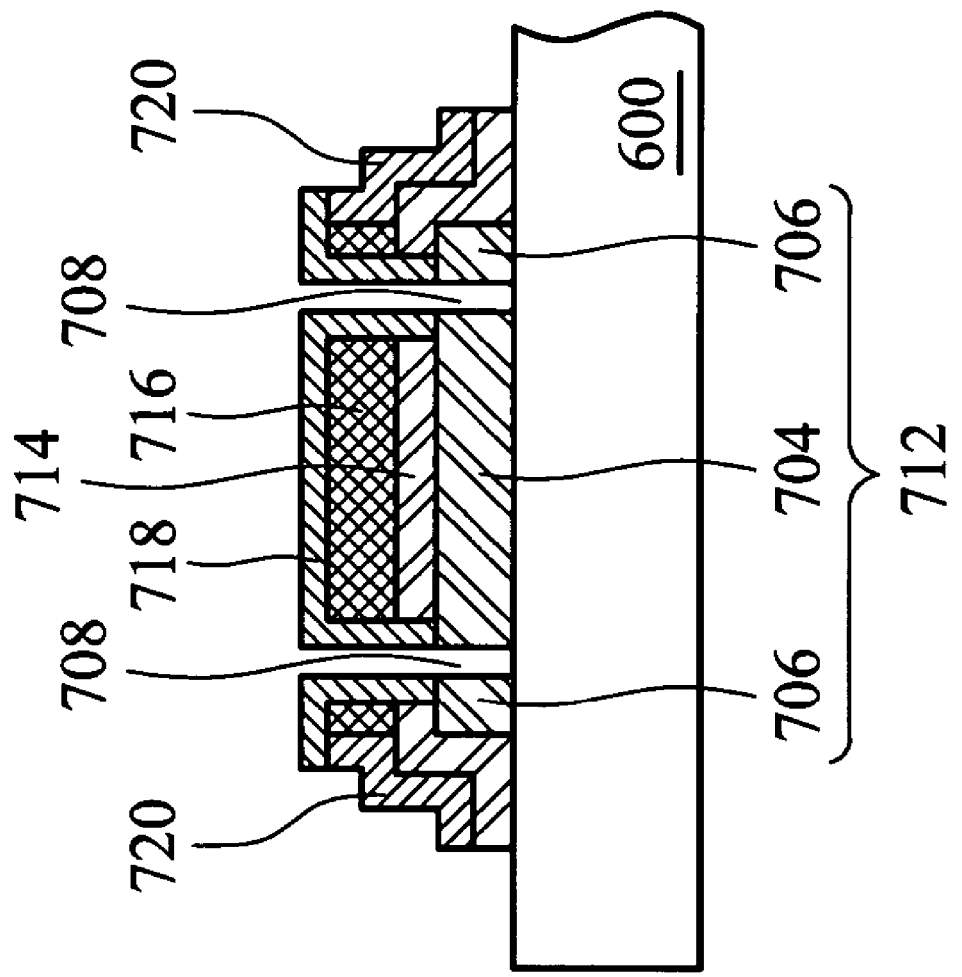
FIG. 7C is a cross section along the line 7C–7C' of FIG. 6A.

FIG. 7A is a plane view of the conductive line. FIG. 7B is a cross section along line 7B–7B' of FIG. 7A and FIG. 7C is a cross section along line 7C–7C' of FIG. 7A. Referring to FIG. 7A, FIG. 7B and FIG. 7C, a first conductive layer 702 includes at least two outer conductive portions 706, a inner conductive portion 704 between the outer conductive portions and connecting portions 710, wherein the inner conductive portion 704 and the outer conductive portions 706 are separated by at least two trenches 708 along the conductive line and connected by the connecting portions 710 corresponding to each trench. The first conductive layer 702 is preferably formed at the same time as a gate electrode 752 of a TFT (Thin Film Transistor) on a display panel 700, and formed of conductive materials, such as Ta, Mo, W, Cr, Al, ITO, and combination thereof.

A dielectric layer 714 preferably formed at the same time as a gate dielectric layer 754 of the TFT is disposed on the first conductive layer 702 without covering the trenches 708 and the connecting conductive portions 710. The dielectric layer is preferably silicon nitride. A second conductive layer 716 is disposed on the dielectric layer 714 without covering the connecting portions 710 of the first conductive layer 702 and the trenches. The second conductive layer 716 is preferably formed of conductive materials, such as Ta, Mo, W, Cr, Al, ITO, or their combination, and formed at the same time as source/drain electrodes 756 of the TFT.

A third conductive layer 718 is disposed on the second conductive layer 716 and the connecting portions 710 of the first conductive layer 702 without covering the trenches. The third conductive layer 716 is preferably formed of transparent conductive material, such as ITO (Indium Tin Oxide), and formed at the same time as pixel electrodes 758 of the display panel. A protective layer 720 is disposed on the sidewall of the first conductive layer 702 and the second conductive layer 716, and formed at the same time as the gate protective layer 760 of the TFT.

In the preferred embodiment of the invention, the conductive line can be a pad, connected to electrodes of a display panel. Consequently, the conductive lines can be repaired by cutting the connection portions 710 of the first conductive layer and the third conductive layer 718 over the connection portions 710 when particles are formed therebetween or the conductive lines are electrically connected with the misaligned bonding lines.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A structure of a liquid crystal display device, comprising:
    an integrated circuit;
    a display panel;
    a conductive line connecting the display panel and the integrated circuit, wherein the conductive line comprises:
    at least two outer conductive portions;
    an inner conductive portion disposed between the outer conductive portions and separated with the outer conductive portions by at least two trenches along the conductive line; and
    at least one connecting portion corresponding to each trench connecting the outer conductive portions and the inner conductive portion.

2. The structure as claimed in claim 1, wherein the connecting portions are thinner than the inner conductive portion and the outer conductive portions.

3. The structure as claimed in claim 1, wherein the conductive line is formed on the display panel.

4. The structure as claimed in claim 1, wherein the inner conductive portion, the outer conductive portions and the connecting portion are formed of conductive materials selected from the group of Ta, Mo, W, Ti, Cr, Al, ITO and combination thereof.

5. The structure as claimed in claim 1, wherein the width of the inner conductive portion is larger than the outer conductive portions.

6. The structure as claimed in claim 1, wherein the connecting portion is disposed at end of the conductive line.

7. The structure as claimed in claim 1, wherein the connecting portion is disposed at middle of the conductive line.

8. A structure of a conductive line, comprising:
    a first conductive layer with at least two outer conductive portions, an inner conductive portion between the outer portions, and a plurality of connecting portions, wherein the inner conductive portion and the outer conductive portions are separated by trenches along the conductive line and connected by the connecting portions;

a dielectric layer disposed on the first conductive layer without covering the connecting portions and the trenches;

a second conductive layer disposed on the dielectric layer without covering the connecting portions and the trenches; and a third conductive layer disposed on the second conductive layer and the connecting portions without covering the trenches.

9. The structure as claimed in claim 8, wherein the conductive line is formed on a display panel.

10. The structure as claimed in claim 8, wherein the first conductive layer and the second conductive layer are formed of conductive materials selected from the group of Ta, Mo, W, Ti, Cr, Al, ITO and combinations thereof.

11. The structure as claimed in claim 8, wherein the width of the inner conductive portion is larger than the outer conductive portions.

12. The structure as claimed in claim 8, wherein the first conductive layer is formed at the same time as a gate electrode of a TFT.

13. The structure as claimed in claim 12, wherein the dielectric layer is formed at the same time as a gate electrode of the TFT.

14. The structure as claimed in claim 13, wherein dielectric layer is silicon nitride.

15. The structure as claimed in claim 12, wherein the second conductive layer is formed at the same time as source/drain electrodes of the TFT.

16. The structure as claimed in claim 8, wherein the third conductive layer is formed at the same time as pixel electrodes.

17. The structure as claimed in claim 8, wherein the third conductive layer is a transparent conductive material.

18. The structure as claimed in claim 17, wherein the transparent conductive material is ITO.

* * * * *